United States Patent
Dalakos

(10) Patent No.: US 6,572,975 B2
(45) Date of Patent: Jun. 3, 2003

(54) OPTICALLY COATED ARTICLE AND METHOD FOR ITS PREPARATION

(75) Inventor: George Theodore Dalakos, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/939,274

(22) Filed: Aug. 24, 2001

(65) Prior Publication Data

US 2003/0039847 A1 Feb. 27, 2003

(51) Int. Cl.$^7$ ............................ B32B 27/00; H05H 1/24
(52) U.S. Cl. ................... 428/451; 428/332; 428/412; 428/413; 428/446; 428/448; 427/578; 427/579; 427/255.7
(58) Field of Search ................ 428/446, 447, 428/448, 451, 220, 332, 412, 413, 522; 427/569, 578, 579, 255.7

(56) References Cited

U.S. PATENT DOCUMENTS

| | | |
|---|---|---|
| 4,827,870 A | 5/1989 | Lee |
| 5,009,920 A | 4/1991 | Lee |
| 5,245,468 A * | 9/1993 | Demiryont et al. ......... 359/359 |
| 5,694,240 A * | 12/1997 | Sternbergh ................ 359/359 |
| 6,157,503 A * | 12/2000 | Knapp ........................ 359/830 |
| 6,164,777 A * | 12/2000 | Li et al. ..................... 351/162 |
| 6,215,802 B1 * | 4/2001 | Lunt ........................... 372/34 |

OTHER PUBLICATIONS

BH Augustine et al., "*Thermal–Optical Switching of a Silicon Based Interference Filter*", American Institute of Physics, J. Appl. Phys. vol. 75 (4), pp. 1875–1878, Feb. 15, 1994.

DJ Lockwood et al., "*Visible Luminescence In Si/SiO$_2$ Superlattices*", Materials Research Society, Mat. Res. Soc. Symp. Proc. vol. 452, pp. 183–194, 1997 (No month).

* cited by examiner

*Primary Examiner*—Deborah Jones
*Assistant Examiner*—Stephen Stein
(74) *Attorney, Agent, or Firm*—Robert P. Santandrea; Noreen C. Johnson

(57) ABSTRACT

An optically coated article comprising a polymeric substrate, such as aromatic polycarbonate, and a plurality of optical coating layers comprising alternate layers of silicon dioxide and amorphous hydrogenated silicon or variations thereof, produced by plasma enhanced chemical vapor deposition. The article is characterized by essentially constant optical characteristics over a wide temperature range.

26 Claims, 6 Drawing Sheets

OPTICALLY COATED ARTICLE AND METHOD FOR ITS PREPARATION

BACKGROUND OF INVENTION

This invention relates to articles having optical coatings and a method for their preparation. More particularly, it relates to the provision of optically coated articles having a thermally stable optical response.

Optically coated articles are useful as interference filters in such applications as thermal-optical switching. They generally comprise a substrate having a number of coatings, the substrate and coatings being transparent to light in various regions of the spectrum, typically the visible and/or short wavelength infrared regions, wherein the coatings having alternating high and low refractive indices. The term "short wavelength infrared" refers to the region in the range of about 700–2,500 nm. An essential feature of the coating system is a substantial difference between the refractive indices of adjacent coatings, typically represented by a ratio of refractive indices (hereinafter "R") of at least about 1.5. Higher ratios are often desirable.

Typical optically coated articles known in the art comprise a glass substrate and alternate coatings of silicon oxide ($SiO_2$) and either tantalum oxide ($Ta_2O_5$) or titanium dioxide ($TiO_2$). The coating systems of such articles have R values of 1.5 and 1.6, respectively.

It would be desirable to produce optical articles in which the coating systems have a higher R value, for example above 2.0. Such values can be obtained by employing alternate coatings of silicon dioxide and amorphous hydrogenated silicon (hereinafter referred to as "a-Si:H") on a fused silica (i.e., glass) substrate. The coatings may conveniently be deposited by plasma enhanced chemical vapor deposition (hereinafter referred to as "PECVD"). It has been found that a $SiO_2$/a-SiH coating system consisting of 46 coating layers and having a total thickness of about 7.5 microns exhibits optical behavior equivalent to a $SiO_2$—$Ta_2O_5$ coating system consisting of 64 layers and having a thickness of 13 microns.

The optical response of an optical article depends on the refractive index and thickness of the coating deposited thereon. Both of these properties are a function of temperature. The thermo-optic coefficient describes the change of the material refractive index as a function of temperature; the thermo-mechanical coefficient, also known as the coefficient of thermal expansion (hereinafter referred to as "CTE"), describes physical dimension changes with temperature.

In the case of glass coated with alternating layers of $SiO_2$ and a-Si:H, there is a profound change in optical behavior with temperature based on the CTE of the substrate and the CTE and thermo-optic coefficient of the coatings. A principal factor in this change is the relatively high thermo-optic coefficient of the a-Si:H layer. Upon heating, therefore, a shift of the interference structure, usually by the center wavelength between the full width at half-maximum (FWHM) of reflected light, is observed. The shift is typically on the order of 7 nm over a 75° C. variation in temperature. The substrate CTE in some cases can be used to compensate the optical shift of the coatings, as just described.

Glass has a CTE on the order of 7.8 ppm/° C. Temperature-related effects on optical behavior (as exemplified by the aforementioned wavelength shift) will be minimized if a substrate is chosen such that its CTE is as close as possible to 66 ppm/° C., whereupon the substrate CTE will essentially cancel out the effects of the coatings. This would be highly desirable.

It is therefore of interest to provide an optical article in which temperature-induced changes in optical performance are minimized.

SUMMARY OF INVENTION

The present invention provides optical articles in which temperature-induced variations in optical performance are essentially negligible. A method of producing such articles is also provided. The basis for the invention is the discovery of the effect of coating a resinous substrate having a CTE on the order of 70 ppm/° C.

In one of its aspects, the invention is an optically coated article comprising a polymeric substrate and a plurality of coating layers, the plurality of layers comprising alternate layers of silicon dioxide and amorphous hydrogenated silicon, said article being transparent to light in the short wavelength infrared region of the spectrum.

Another aspect of the invention is a method for producing an optically coated article which comprises depositing alternate coating layers of silicon dioxide and amorphous hydrogenated silicon on a thermoplastic resin substrate, the substrate being chosen so that said article is transparent to light in the short wavelength infrared region of the spectrum.

DESCRIPTION OF INVENTION

Figure 1:
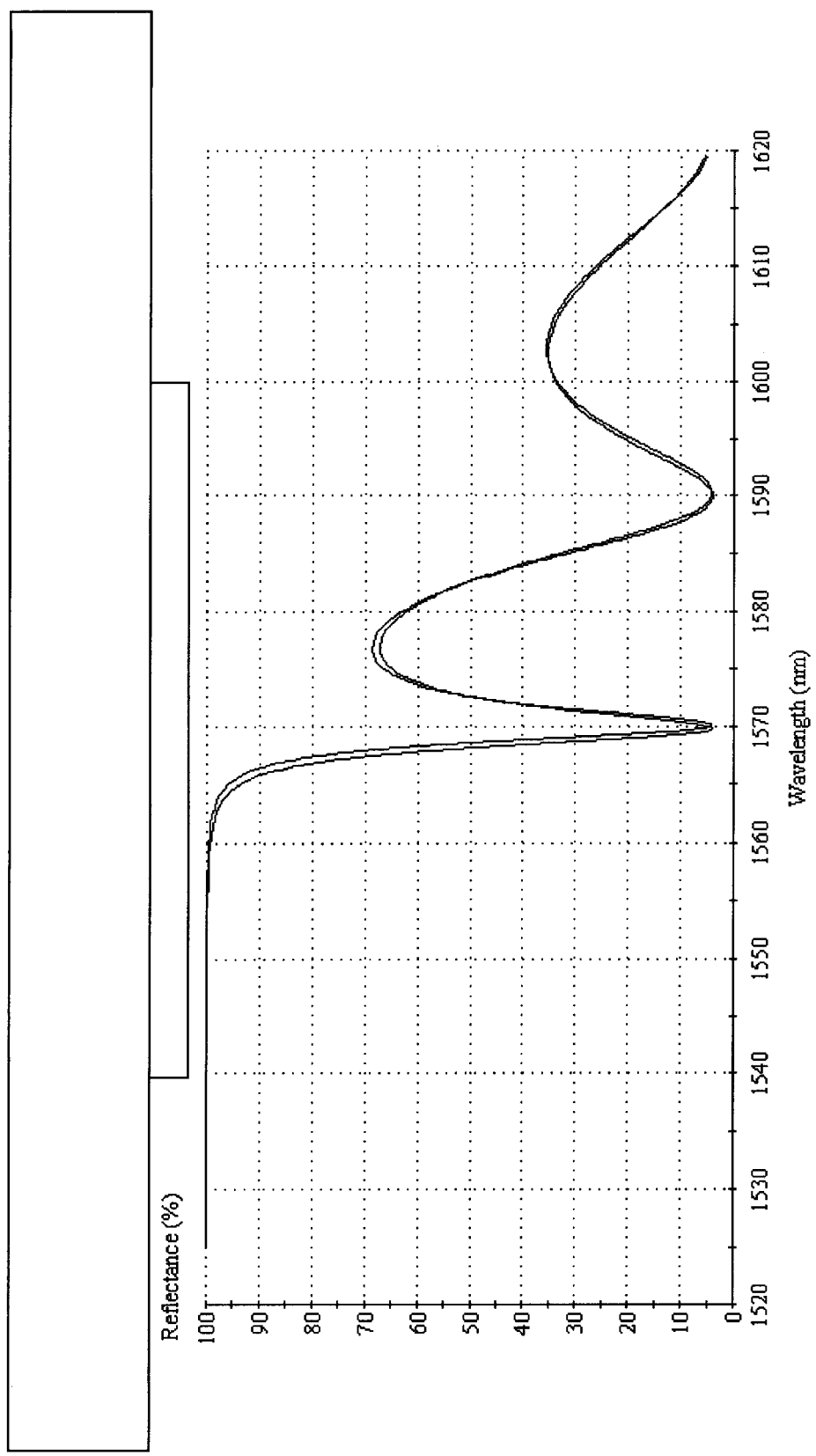
FIG. 1 is a comparison of the optical response of prior-art $SiO_2$/a-Si:H and $SiO_2$/$Ta_2O_5$ multilayer coating systems.

In the following description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing a preferred embodiment of the invention and are not intended to limit the invention thereto.

A prior-art $SiO_2$/a-Si:H coating system has the layered configuration shown below:

Air|0.5H
LHLHLHLHLHLHLHLHLHLHLHLHLHLHLHLHLHLHL
HLHL 0.5H|substrate

The prior-art SiO$_2$/a-Si:H layered configuration consists of 46 alternate layers of a-SiH (designated as "H") and SiO$_2$ (designated as "L") and has a total thickness of about 7.5 microns. Each layer unit thickness corresponds to a quarter-wave optical thickness.

A prior-art SiO$_2$/Ta$_2$O$_5$ coating system has the layered configuration shown below:

Air|0.5H
LHLHLHLHLHLHLHLHLHLHLHLHLHLHLHLHLHL
HLHLHLHLHLHLHLHLHLHLHLHLHL 0.5H|Substrate The prior-art SiO$_2$/Ta$_2$O$_5$ layered configuration consists of 64 alternating layers of SiO$_2$ (designated "L") and Ta$_2$O$_5$ (designated "H") and has a total thickness of about 13 microns. Each layer unit thickness corresponds to a quarter-wave optical thickness.

Figure 2:
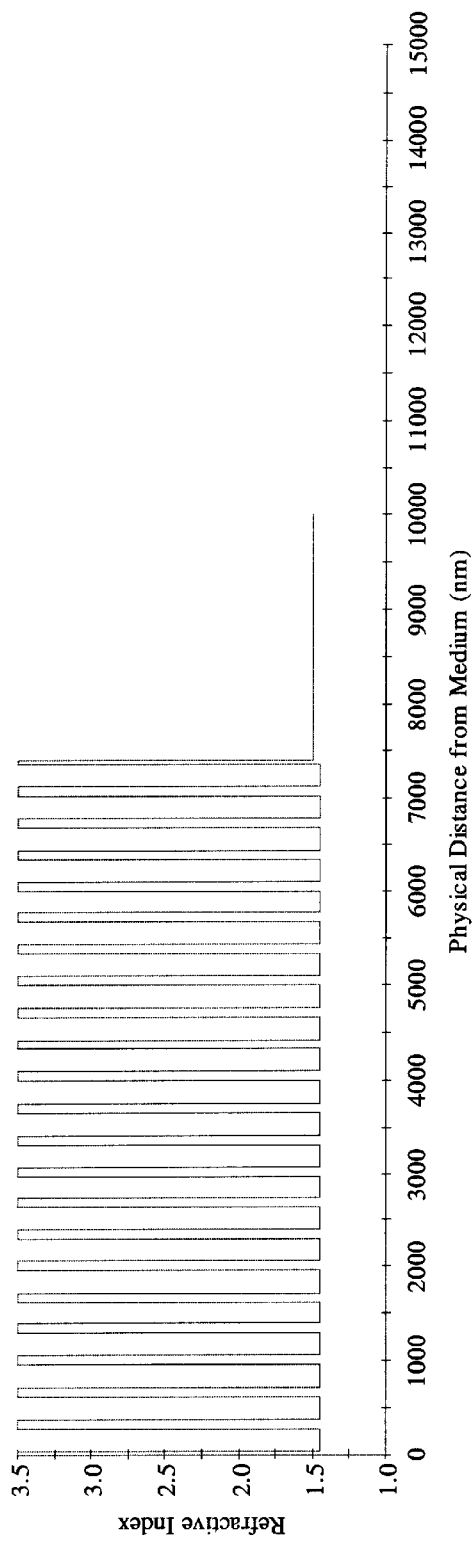
FIG. 2 is a plot of the refractive index profile of the prior-art $SiO_2$/Si multilayer coating system of FIG. 1 as a function of thickness.
Figure 3:
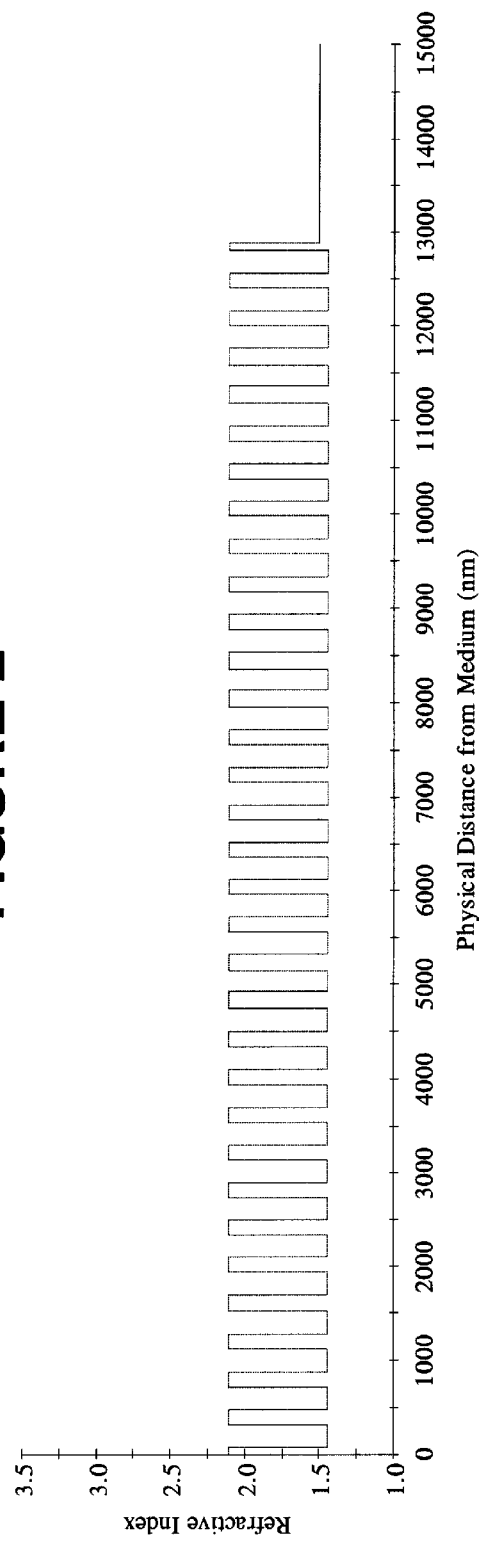
FIG. 3 is a plot of the refractive index profile of the prior-art $SiO_2$/$Ta_2O_5$ multilayer coating system as a function of thickness.

The layered SiO$_2$/a-Si:H and SiO$_2$/Ta$_2$O$_5$ configurations exhibit almost identical optical performance in terms of reflectance, as shown in FIG. 1. The refractive index profiles of the SiO$_2$/a-Si:H and SiO$_2$/Ta$_2$O$_5$ designs are shown in FIG. 2 and FIG. 3, respectively.

Any thermoplastic resin substrate may be employed according to the present invention, provided its use can produce an article which is transparent to light in the short wavelength infrared region of the spectrum.

Among the particularly useful resins of this type are polymethyl methacrylate and aromatic polycarbonates, especially bisphenol A polycarbonate; that is, the polycarbonate derived from 2,2-bis(4-hydroxyphenyl)propane. Bisphenol A homopolycarbonate is especially preferred.

In one embodiment, the substrate is a thermosetplastic material. The thermosetplastic material may be one of an epoxy, a cross-linked acrylic, a polyester, a melamine, and a silicone.

The thickness of the substrate is not critical for the purposes of the invention. Illustrative thicknesses are in the range of about 1–50 mm. Excessive substrate thickness, however, can result in high absorption in certain areas within the near infrared region. This absorption may or may not be problematic, depending on the application.

A plurality of coating layers comprising alternate layers of SiO$_2$ and a-Si:H is deposited on the substrate. The identity of the layer actually contacting the substrate is not critical, with either SiO$_2$ or a-Si:H being suitable for this purpose. It is, however, frequently convenient for the first layer to be of a-Si:H. The coating configuration of the present invention may include up to about 500 layers. In one embodiment, between about 10 and about 100 layers may be deposited. In another embodiment, the plurality of coating layers comprises at least one layer and up to about 10 layers.

Figure 4:
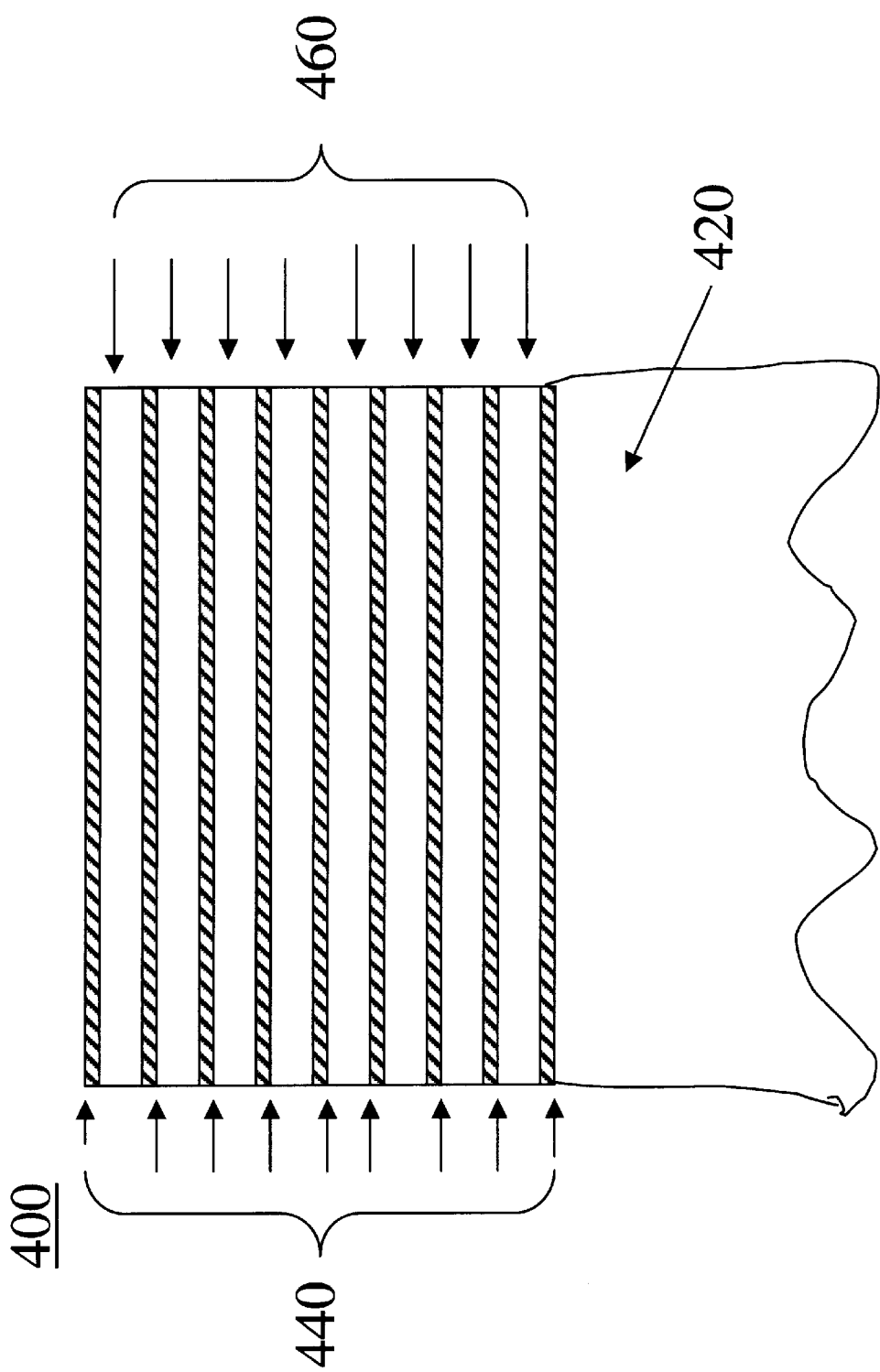
FIG. 4 is a schematic of a quarter-wave optical thickness stack of the present invention.

While layer thickness is not critical, it is frequently advantageous for the thickness of a single layer to correspond to a quarter-wavelength of light at a single wavelength probe value within the range of light to be transmitted. The thickness of each layer is related to other parameters as follows:

$$L = m\lambda/4n,$$

where L is layer thickness, m is a multiple of the basic quarter-wave optical unit (m=1), $\lambda$ is the wavelength of the probe and n is the refractive index of the layer. Typically, a layer thickness in the range of between about 100 and about 300 nm is employed, but this value is based to some extent upon the range of other parameters of interest. A typical multilayered structure 400 using these unit layer thicknesses deposited on a substrate 420 is schematically shown in FIG. 4. FIG. 4 shows a stack of these quarter-wave basic unit building blocks on a massive medium substrate material. The layer thickness may be altered from the quarter-wave optical thickness as dictated by the optical coating design.

The deposited layers may be arranged either periodically or non-periodically. Non-periodic layers may be useful, for example, in computer-optimized designs or as added layers to a basic design included for anti-reflective purposes. Alternatively, the optical coating may comprise at least one symmetric profile and multiples or variations thereof. Such coatings may be useful, for example, in bandpass, narrow bandpass, long or shortpass filters.

It is also within the scope of the invention for the optical coating to comprise a non-homogeneous layered structure. One such non-homogenous design is a sinusoidal periodic refractive index profile commonly referred to as a "rugate" design.

In another embodiment of the invention, the a-Si:H coatings are doped with various elements known in the art, such as, but not limited to, nitrogen, germanium, phosphorous, boron and carbon.

The articles of this invention are typically prepared by deposition of the desired coatings on the substrate. Any convenient method of deposition may be employed, with PECVD often preferred by reason of its particular suitability for this purpose. PECVD procedures and apparatus for their performance are well known in the art. SiO$_2$ and a-Si:H layers may, respectively, be produced by plasma dissociation of suitable precursors, typically silane (SiH$_4$) for a-Si:H and a mixture of silane and nitrous oxide (N$_2$O) for SiO$_2$, the molar ratio of nitrous oxide to silane in the latter mixture typically being in the, range of about 20–100:1. Suitable plasmas include those of noble gases, nitrogen, ammonia and hydrogen, as well as combinations thereof, with argon often being preferred. Deposition time for a layer of the desired thickness can be determined by simple experimental comparison with standards involving various time periods.

The invention is illustrated by an example in which a transparent bisphenol A homopolycarbonate substrate was coated with a layer of silicon and then with alternating layers of SiO$_2$ and silicon to a total of 24 layers, the layer thicknesses being 133 nm for silicon and 263 nm for SiO$_2$. The particular design is referred to as a narrow bandpass design. The requirements for such a design include high transmission at the wavelength of interest while reflecting both higher and lower wavelength in that near vicinity. The multilayer configuration 400 for the design is shown in FIG. 4. The SiO$_2$/a-Si:H layers had the following configuration:

Air|LHLHLHLLHLHLHLHLHLHLLHLHLHLH|Polycarbonate, where H (designated 440 in FIG. 4) signifies a layer of a-Si:H and L (designated 460 in FIG. 4) signifies a layer of SiO$_2$.

Figure 5:
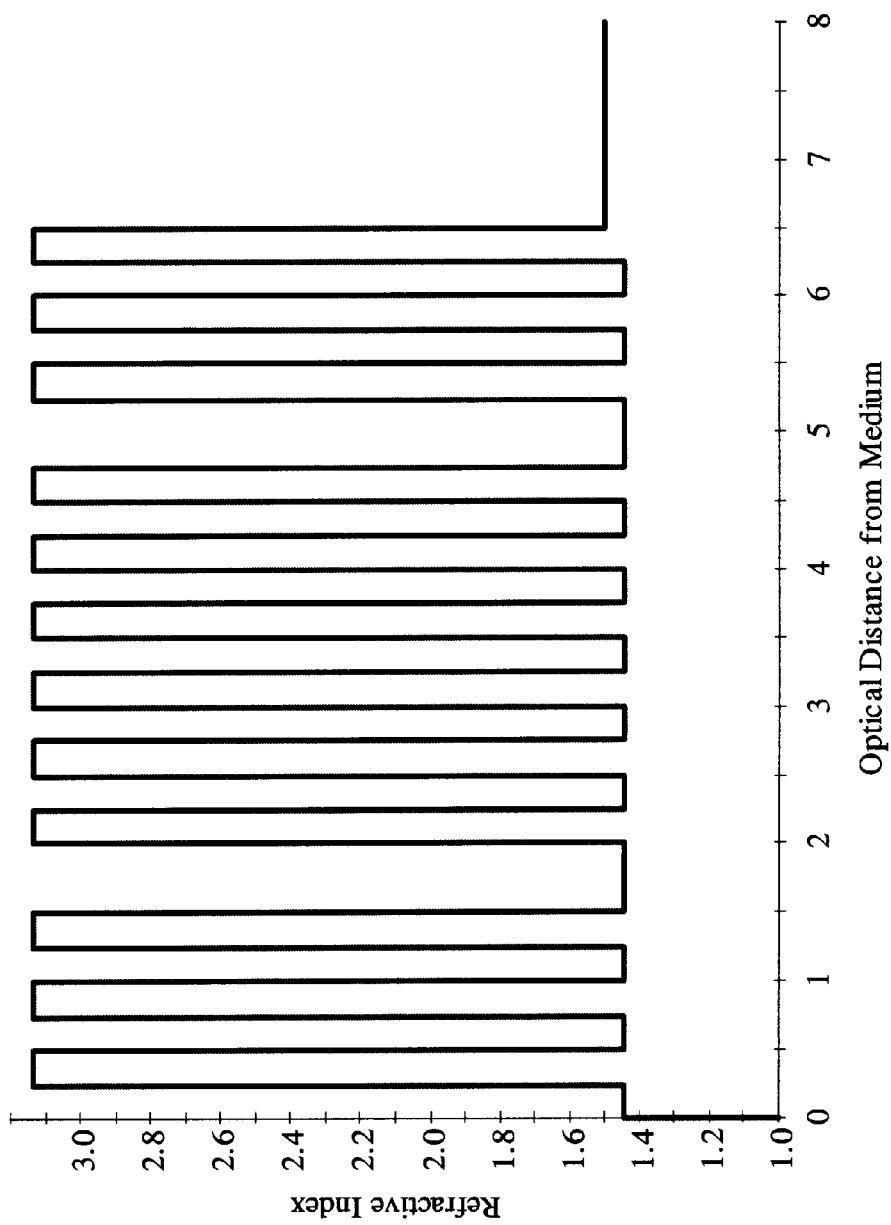
FIG. 5 is the refractive index profile of the 24 layer design stack of the present invention deposited on polycarbonate plotted as a function of optical thickness.

Each of the unit thickness layers has a quarter-wave optical thickness unit as described above. The refractive index profile of the design is shown in FIG. 5. The scale is in units of optical thickness; therefore each unit layer thickness is designated by quarter-wave (0.25$\lambda$) increments. The double unit SiO$_2$ thickness, designated "LL", allows the transmission at the wavelength of interest while allowing high reflection at the wavelengths outside the center-band wavelength.

The silicon layers were deposited by PECVD of silane (provided at a flow rate of 200 SCCM) using argon (provided at a flow rate of 1,000 SCCM) at a pressure of 200 millitorr as the plasma gas and a RF power level of 200 watts. The SiO$_2$ layers were deposited by PECVD of silane (provided at a flow rate of 200 SCCM). The silane was diluted by argon to 2 mole percent. Nitrous oxide, provided at a flow rate of 200 SCCM, was used as the plasma gas. The SiO$_2$ layers were deposited using the same pressure and power level. Silicon is deposited according to the reaction:

$$SiH_4(gas) \rightarrow Si(solid\ film) + 2H_2(gas),$$

and silicon oxide is deposited by the reaction:

$$SiH_4(gas) + 2N_2O(gas) \rightarrow SiO_2(solid\ film) + N_2, H_2, NH_3\ (gases)$$

Due to incomplete dissociation of the precursors and low substrate temperatures, the final compositions are not exactly stoichiometric and contain considerable impurities, most notably hydrogen. This has an effect on the optical properties to a varying degree.

Figure 6:
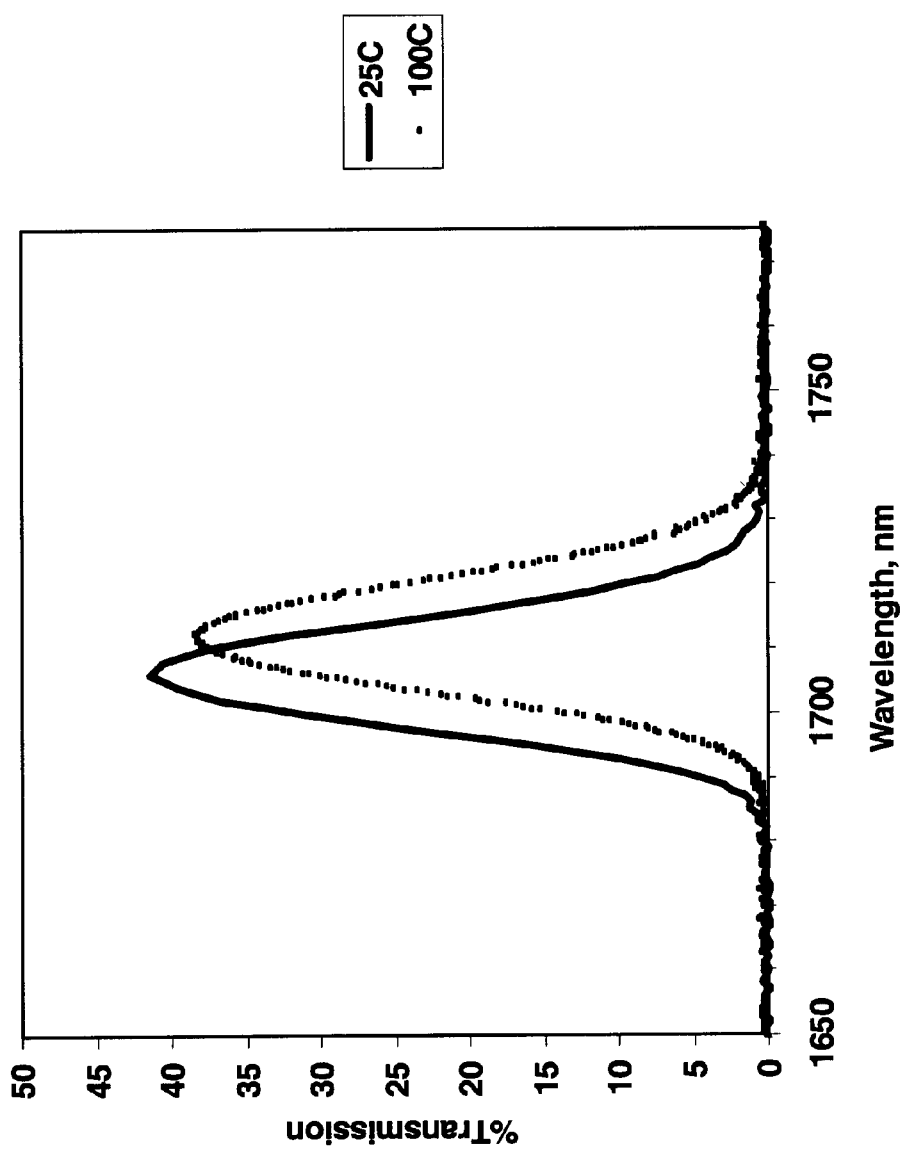
FIG. 6 is the measured percent transmission plotted as a function of wavelength for the 24 layer stack of the present invention deposited on glass.
Figure 7:
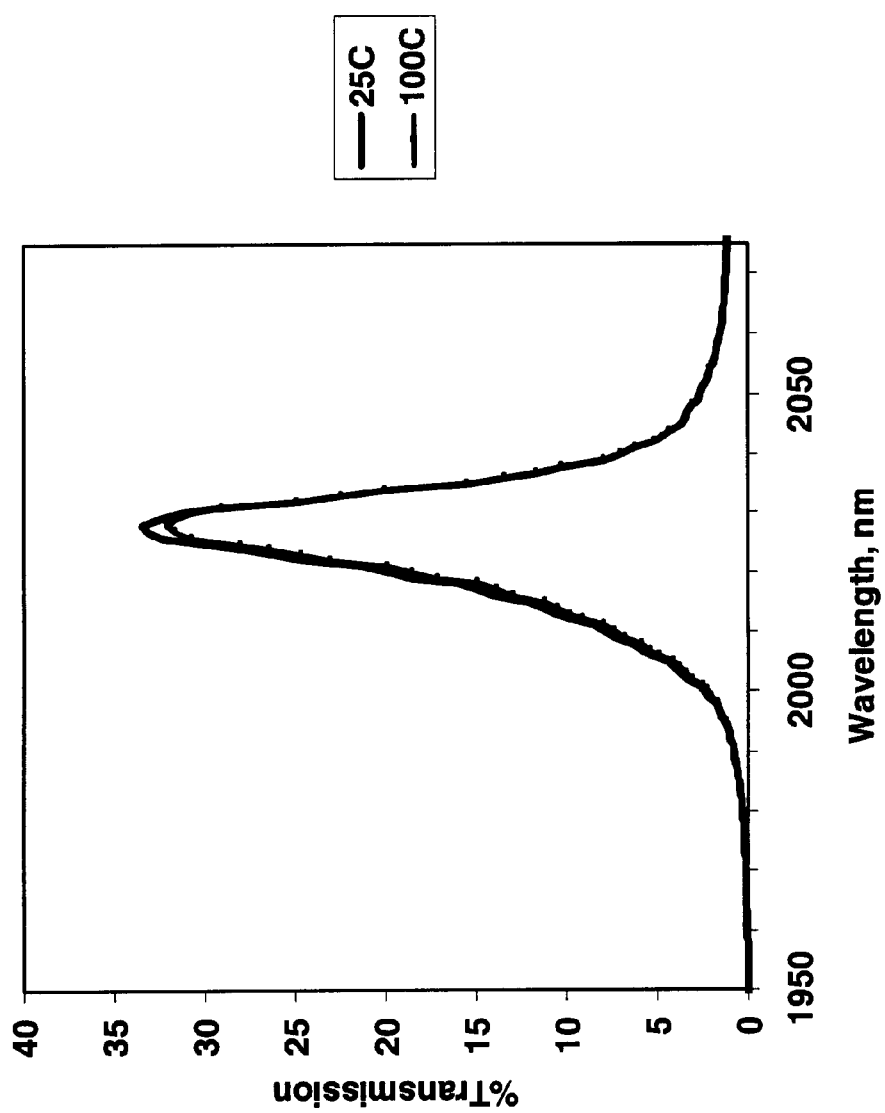
FIG. 7 is the measured percent transmission plotted as a function of wavelength for the 24 layer stack schematically shown in FIG. 4 deposited on a polycarbonate substrate.

The thermal shift in the optically coated article thus prepared, over a temperature range from ambient to about 100° C., was on the order of 1 nm. By contrast, the thermal shift of a control article in which the coating layers were deposited on a glass substrate was about 7 nm. This is shown by transmission spectra in FIGS. 6 and 7. FIG. 6 shows the 7 nm shift of the multilayer on glass upon heating from 25° C. to 100° C., and FIG. 7 shows the multilayer performance on polycarbonate where there is a virtual absence of any movement upon heating the device from 25° C. to 100° C.

While typical embodiments have been set forth for the purpose of illustration, the foregoing descriptions and examples should not be deemed to be a limitation on the scope of the invention. Accordingly, various modifications, adaptations, and alternatives may occur to one skilled in the art without departing from the spirit and scope of the present invention.

What is claimed is:

1. An optically coated article comprising a polymeric substrate and a plurality of coating layers, wherein the plurality of layers forms a nonhomogeneous layered structure comprising alternate layers of silicon dioxide and amorphous hydrogenated silicon, and wherein the optically coated article is transparent in the short wavelength infrared region of the spectrum.

2. The optically coated article according to claim 1, wherein the substrate is a thermoplastic resin.

3. The optically coated article according to claim 2, wherein the thermoplastic resin has a coefficient of thermal expansion that is compatible with a coefficient of thermal expansion of the plurality of coating layers.

4. The optically coated article according to claim 2, wherein the substrate is one of polymethyl methacrylate and an aromatic polycarbonate.

5. The optically coated article according to claim 1, wherein the substrate is a thermosetplastic material.

6. The optically coated article according to claim 5, wherein the thermosetplastic material is one of an epoxy, a cross-linked acrylic, a polyester, a melamine, and a silicone.

7. The optically coated article according to claim 1, wherein the plurality of layers is arranged in a non-periodic array.

8. The optically coated article according to claim 1, wherein the plurality of layers comprises at least one symmetric profile and multiples thereof.

9. The optically coated article according to claim 1, wherein the optically coated article is one of a bandpass filter, a narrow bandpass filter, a long-pass filter, and a shortpass filter.

10. The optically coated article according to claim 1, wherein the nonhomogeneous layered structure has a sinusoidal periodic refractive index profile.

11. The optically coated article according to claim 1, wherein the amorphous hydrogenated silicon is doped with at least one of nitrogen, germanium, phosphorous, boron, and carbon.

12. The optically coated article according to claim 1, wherein each coating layer is between about 100 nm and about 300 nm thick.

13. The optically coated article according to claim 1, wherein the plurality of layers comprises up to about 500 layers.

14. The optically coated article according to claim 13, wherein the plurality of layers comprises at least one layer and up to about 10 layers.

15. The optically coated article according to claim 13, wherein the plurality of layers comprises between about 10 and about 100 layers.

16. The optically coated article according to claim 1, wherein the layer contacting the substrate comprises amorphous hydrogenated silicon.

17. The optically coated article according to claim 1, wherein the layer contacting the substrate comprises silica.

18. An optically coated article comprising a bisphenol A homopolycarbonate substrate and between about 10 and about 100 coating layers, wherein said layers comprises alternate layers of silicon dioxide and amorphous hydrogenated silicon, wherein the layer contacting said substrate comprises amorphous hydrogenated silicon, and wherein said article is transparent in the short wavelength infrared region of the spectrum.

19. A method for producing an optically coated article, the method comprising the steps of depositing a plurality of alternate coating layers of silicon dioxide and amorphous hydrogenated silicon on a polymeric substrate to form a nonhomogeneous layered structure, wherein said optically coated article is transparent in the short wavelength infrared regions of the spectrum.

20. The method according to claim 19, wherein said plurality of alternate coating layers are deposited by plasma enhanced chemical vapor deposition.

21. The method according to claim 19, wherein the substrate is poly(methyl methacrylate) or an aromatic polycarbonate.

22. The method according to claim 19, wherein the substrate is an aromatic polycarbonate.

23. The method according to claim 19, wherein the substrate is bisphenol A homopolycarbonate.

24. The method according to claim 19, wherein each coating layer is between about 100 nm and about 300 nm thick.

25. The method according to claim 19, wherein the layer contacting the substrate comprises amorphous hydrogenated silicon.

26. A method for producing an optically coated article, the method comprising the step of depositing a plurality of alternate coating layers of silicon dioxide and amorphous hydrogenated silicon on a bisphenol A homopolycarbonate substrate, wherein the layer contacting said substrate comprises amorphous hydrogenated silicon and wherein the plurality of alternate coating layers comprises between about 10 and about 100 layers, and wherein said optically coated article is transparent in the short wavelength infrared region of the spectrum; wherein the plurality of alternate coating layers are deposited by plasma enhanced chemical vapor deposition, wherein amorphous hydrogenated silicon is deposited using an argon plasma with silane, and wherein silica is deposited with silane and nitrous oxide.

* * * * *